United States Patent
Kato (10) Patent No.: US 6,797,407 B2
(45) Date of Patent: Sep. 28, 2004

(54) METALLIC PLATE MATERIAL FOR ELECTRIC/ELECTRONIC INSTRUMENT AND ELECTRIC/ELECTRONIC INSTRUMENT USING SAME

(75) Inventor: Osamu Kato, Tokyo (JP)

(73) Assignee: The Furukawa Electric Co., Ltd., Tokyo (JP)

(*) Notice: Subject to any disclaimer, the term of this patent is extended or adjusted under 35 U.S.C. 154(b) by 171 days.

(21) Appl. No.: 10/029,607

(22) Filed: Dec. 20, 2001

(65) Prior Publication Data

US 2002/0127424 A1 Sep. 12, 2002

(30) Foreign Application Priority Data

Dec. 21, 2000 (JP) .......................... 2000-389514
Dec. 10, 2001 (JP) .......................... 2001-376363

(51) Int. Cl.$^7$ .......................... B32B 15/04; B32B 15/08; B32B 15/18
(52) U.S. Cl. .................. 428/626; 428/336; 428/339; 428/457; 428/425.8; 428/418; 428/461
(58) Field of Search .................. 428/621, 624, 428/626, 215, 336, 339, 457, 461, 467, 425.8, 418, 413, 423.1, 500, 458, 484

(56) References Cited

U.S. PATENT DOCUMENTS

| | | | | |
|---|---|---|---|---|
| 3,908,050 A | * | 9/1975 | Gor .......................... | 427/388.3 |
| 5,082,698 A | * | 1/1992 | Anderson et al. ............ | 427/386 |
| 5,378,291 A | | 1/1995 | Ara et al. ................... | 148/251 |
| 5,456,953 A | | 10/1995 | Gosselin et al. ............ | 427/522 |
| 5,578,669 A | * | 11/1996 | Odawa et al. ............... | 524/414 |
| 5,944,923 A | * | 8/1999 | Hayashi et al. ............. | 148/537 |
| 6,086,992 A | | 7/2000 | Kato et al. .................. | 428/336 |
| 6,420,477 B1 | * | 7/2002 | Hamamura et al. .......... | 524/589 |
| 6,479,152 B1 | * | 11/2002 | Miyauchi et al. ............ | 428/418 |
| 6,514,619 B2 | * | 2/2003 | Shimada et al. ............. | 428/418 |
| 2002/0098367 A1 | * | 7/2002 | Mori et al. .................. | 428/457 |

FOREIGN PATENT DOCUMENTS

| | | |
|---|---|---|
| EP | 0 613 931 A2 | 2/1994 |
| EP | 0 697 279 A2 | 2/1996 |
| EP | 1 095 989 A2 | 5/2001 |
| EP | 1 099 485 A2 | 5/2001 |
| JP | 05-320685 | 12/1993 |
| JP | 09-255759 | 9/1997 |
| JP | 11-140345 | 5/1999 |
| WO | WO 00/52226 | 9/2000 |
| WO | WO 01/98392 A1 | 12/2001 |

* cited by examiner

*Primary Examiner*—Michael La Villa
(74) *Attorney, Agent, or Firm*—Knobbe, Martens, Olson & Bear, LLP (57) ABSTRACT

A metallic plate material used as a material for, for example, a casing for containing parts of an electric/electronic instrument, which is good in earthing properties, shield properties against electromagnetic waves, formabilities, lubricity, sliding properties, and resistance to solvents. The metallic plate material comprises a resin-coated metallic plate material. The resin coating contains, as resin, at least one substance chosen from a group consisting of acrylic-based resin, epoxy-based resin, and urethane-based resin, and contains water in the amount of 1 to 50 mass % and a lubricant in the amount of 0.1 to 20 mass %, and has a thickness of 0.05 to 5 μm.

11 Claims, 5 Drawing Sheets

COATING MATERIAL

FIG. 6

POSITION WHERE COATING MATERIAL IS SUPPLIED

METALLIC PLATE MATERIAL FOR ELECTRIC/ELECTRONIC INSTRUMENT AND ELECTRIC/ELECTRONIC INSTRUMENT USING SAME

BACKGROUND

1. Field of the Invention

The present invention relates to a metallic plate material which is a material for, for example, a casing for containing, parts of an electric/electronic instrument. More specifically, the present invention relates to a metallic plate material which comprises a resin-coated metallic plate material being good in earthing properties, shield properties against electromagnetic waves, formabilities, sliding properties, resistance to solvents, etc.

2. Prior Art

Generally, for example, a casing for containing parts of various kinds of electric/electronic instruments is produced by, for example, forming a metallic thin plate having a surface coating.

In forming performed in that case, it has become general to use volatile press oil in order to omit a process of cleaning after press-molding. Therefore, it is required that the resin-coated metallic thin plate should have good formabilities. In some cases, press-molding is preformed using ordinary press oil, and in that case, solvent degreasing needs to be performed after press-molding. Therefore, it is also required that the metallic thin plate having a surface coating should have resistance to solvents.

For a casing of a machine wherein modular components are frequently attached to or detached from a main body, like a personal computer wherein an integrated-type disc drive is attached to or detached from a main body in a casing, it is required that the surface of the metallic thin plate having a surface coating should have good sliding properties.

Further, in order that the appearance of a casing may not be deteriorated by fingerprints and flaws when an instrument is assembled, it is required that the casing should have resistance to fingerprints and resistance to scraches.

Thus, a resin-coated metallic thin plate having a surface coating used for producing a casing for an electric/electronic instrument needs to be good in formabilities, resistance to solvents, sliding properties, resistance to fingerprints, resistance to scratches, etc.

In order to meet the requirements as above, a resin-coated metallic plate material is used. However, generally, a resin coating is insulator. Therefore, a casing made of a resin-coated metallic plate material cannot be earthed, and cannot satisfactorily exhibits a shield function properties against electromagnetic waves from electric/electronic circuits of parts of an electric/electronic instrument contained in the casing.

The shield properties against electromagnetic waves and earthing properties of the resin-coated metallic plate material can be improved by improving the electrical conductivity of the resin coating, or in other words, decreasing the degree of the electrical resistance thereof. Thus, in order to deal with the above-mentioned problems, there has been proposed a resin-coated metallic plate material which contains, as a major component, water-soluble polymer wax having an electrically-conductive auxiliary agent such as metallic soap, metallic powder, or graphite powder mixed into (see Japanese Unexamined Patent Publication No. Hei 5-320685).

There has been also proposed a resin-coated metallic plate material to which metallic particles are added (see Japanese Unexamined Patent Publication No. Hei 9-255759, Japanese Unexamined Patent Publication No. Hei 11-140345, etc.).

However, the prior art as above has the following problems:

For example, when a metallic plate material is formed, an electrically-conductive agent such as metallic powder contained in a resin coating may fall off by the resin coating, which forms a surface of the metallic plate material, being rubbed by a molding machine, and/or by the plate material being transformed. The metallic powder that has fallen off may come into electric circuits or precision drive portions of parts of an electric/electronic instrument in a casing, and make the electric/electronic instrument malfunction.

Further, the resin coating of this type has electrical conductivity only at the places where the electrically-conductive agent exists. Since the shape and distribution of the electrically-conductive agent affects the electrical conductivity, the electrical conductivity varies to a large degree, according to the place. Therefore, the casing made of this plate material does not allow an electric/electronic instrument to be earthed at every desired place. The electric/electronic instrument may not be able to be earthed at some place of the casing.

OBJECTS AND SUMMARY OF THE INVENTION

An object of the present invention is to provide a metallic plate material coated with an electrically-conductive resin coating which does not contain an electrically-conductive agent in the form of particles, and which is good in earthing properties, shield properties against electromagnetic waves, formabilities, sliding properties and resistance to solvents, and provide an electric/electronic instrument using this metallic plate material.

In order to attain the above object, the present invention provides a metallic plate material for an electric/electronic instrument comprising a resin-coated metallic plate material, wherein the resin coating contains, as resin, at least one substance chosen from a group consisting of acrylic-based resin, epoxy-based resin, and urethane-based resin, and contains water in the amount of 1 to 50 mass % and a lubricant in the amount of 0.1 to 20 mass %, and the resin coating has a thickness of 0.05 to 5 $\mu$m.

Further, the present invention provides an electric/electronic instrument using this metallic plate material.

DETAILED DESCRIPTION

In the metallic plate material according to the present invention, an electrically-conductive agent as mentioned above is not mixed into a resin coating that coats a surface of a metallic plate. However, the resin coating itself has electrical conductivity. In addition, it has also good formabilities and good sliding properties.

Prior to describing the composition and other features of the resin coating, what are measured as indices of the properties above will be explained.

Figure 1:
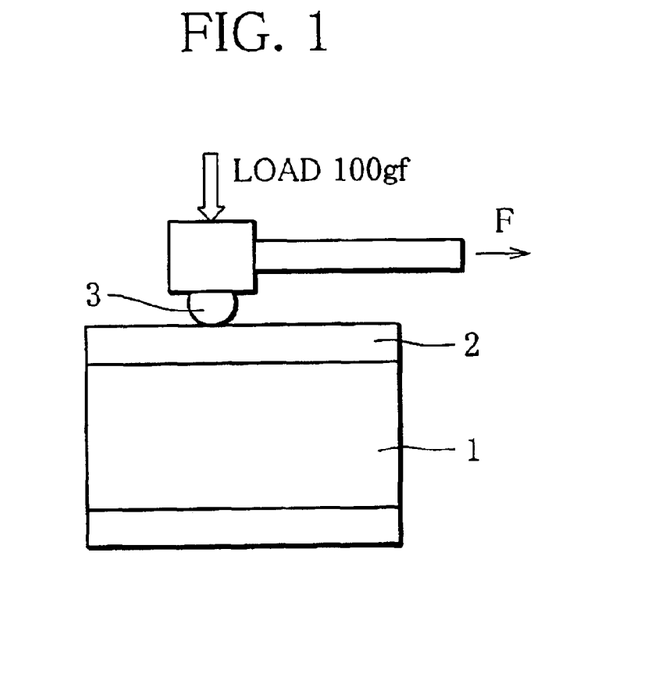
FIG. 1 is a schematic illustration of a device for measuring the coefficient of friction of a resin coating.

First, as an index of formabilities, the coefficient of friction that represents lubricity of the surface of a resin coating 2 is adopted. As shown in FIG. 1, the coefficient of friction is measured with a Bauden test instrument.

Specifically, a contactor 3 which is an SUS globe of 3 mm in diameter is compressed against the surface of a resin coating 2 of a metallic plate material with a load of 100 gf. In that state, force F (gf) required to move the contactor 3 in a direction indicated by an arrow is measured, and a value F/100 is obtained as a coefficient of friction ($\mu$k). When the coefficient of friction is smaller, it means that the metallic plate material has better formabilities.

Figure 2:
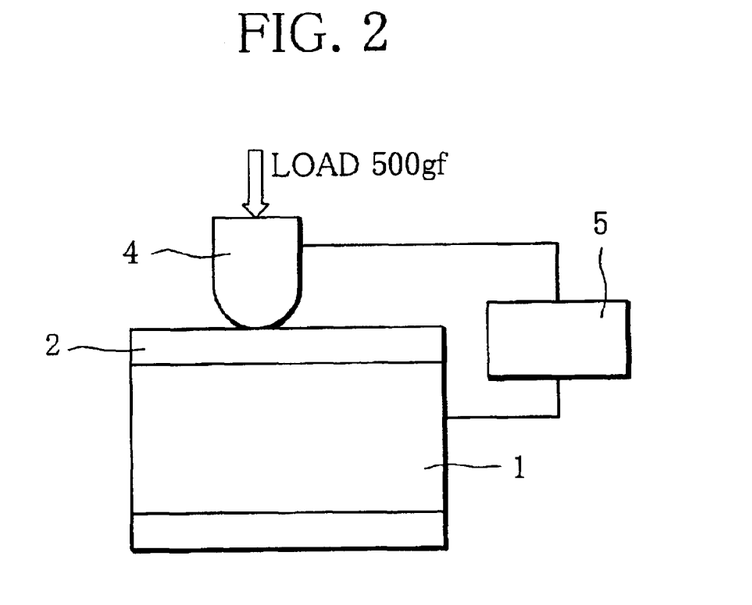
FIG. 2 is a schematic illustration of a device for measuring the electrical conductivity of a resin coating.

The shield properties against electromagnetic waves and earthing properties of a resin-coated metallic plate material can be evaluated by the electrical conductivity of the resin coating, and the electrical conductivity of the resin coating 2 is evaluated by the contact electrical resistance measured with a device shown in FIG. 2.

Specifically, the shield properties against electromagnetic waves and earthing properties of a resin-coated metallic plate material can be evaluated by the electrical conductivity of the resin coating, and the abovesaid contact electrical resistance is measured with a tester 5 in a state that a steel probe 4 having an end of 5 mm in radius is compressed against the surface of a resin coating 2 of a metallic plate material with a load of 500 gf and that a current is made to flow between a metallic plate 1 and the steel probe 4. In the present invention, it is considered good when the contact electrical resistance of the resin coating 2 is 100 Ω or smaller. It is more desirable that the contact electrical resistance of the resin coating 2 is 50 Ω or smaller.

Figure 3:
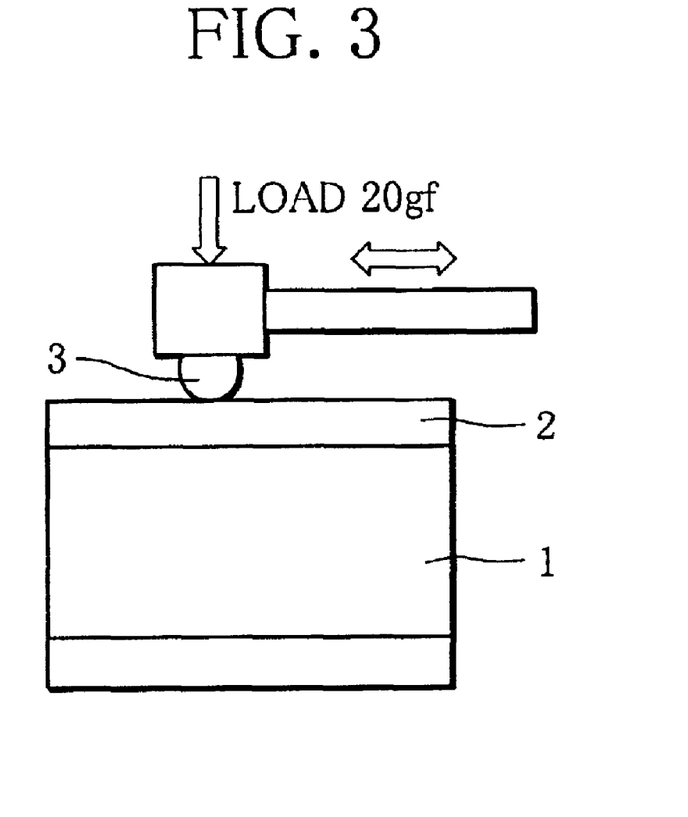
FIG. 3 is a schematic illustration of a device for measuring the sliding properties of a resin coating.

The sliding properties of a resin coating 2 are evaluated by the coefficient of friction after sliding measured with a device shown in FIG. 3.

Specifically, the contactor 3 shown in FIG. 1 is compressed against the surface of a resin coating 2 with a load of 20 gf, and in that state, the contactor 3 is made to go and come back five times at a speed of 5 mm/s. Then, the coefficient of friction is measured to thereby evaluate the sliding properties.

Figure 4:
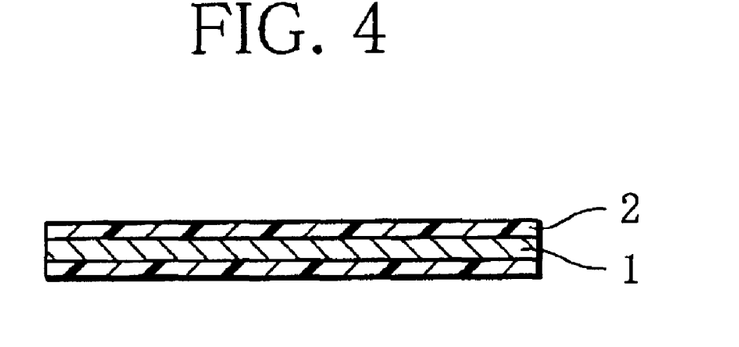
FIG. 4 shows a cross section of an example of a metallic plate material according to the present invention.

FIG. 4 shows an example of the metallic plate material according to the present invention. The illustrated metallic plate material has a structure wherein each surface of a metallic plate 1 as a substrate is coated with a resin coating 2 which will be described later.

The material for the metallic plate 1 and the size and shape thereof are not restricted to any special ones. They are chosen appropriately, in accordance with the use for the to-be-produced metallic plate material. For example, a galvanized steel plate, a stainless steel plate, an aluminum plate, a variety of aluminum alloy plates, a copper plate, a copper alloy plate etc. can be used.

The resin coating 2 needs to contain, as essential components, resin, water and a lubricant, which will be described later. The thickness of the resin coating 2 needs to be 0.05 to 5 $\mu$m.

The resin consists of any one of acrylic-based resins, epoxy-based resins and urethane-based resins, or a mixture of two or more of those resins.

As an acrylic-based resin, for example, acrylate resin, methacrylate resin, methyl methacrylate resin, isopropyl methacrylate resin, etc. can be used. As an epoxy-based resin, for example, bisphenol A epoxy resin, acrylic modified epoxy resin, bisphenol F epoxy resin, etc. can be used. As an urethane-based resin, for example, polyether urethane resin, polycarbonate urethane resin, etc. can be used.

It is an essential requirement that the resin coating 2 contains water. The water is a component for ensuring that the resin coating 2 has electrical conductivity. The amount of water contained in the resin coating 2 is arranged to be 1 to 50 mass %.

This is because when the amount of water contained in the resin coating 2 is less than 1 mass %, it makes the electrical conductivity worse, and therefore makes the earthing properties and the shield properties against electromagnetic waves worse. On the other hand, when the amount of water contained in the resin coating 2 is more than 50 mass %, it makes the resistance to solvents worse. For the resistance to solvent, the desirable amount of water contained in the resin coating is 1 to 50 mass %.

A lubricant, which is another essential component, is a component for improving the formabilities of the produced metallic plate material. The amount of the lubricant contained in the resin coating 2 is arranged to be 0.1 to 20 mass %.

This is because when the amount of the lubricant contained in the resin coating 2 is less than 0.1 mass %, the coefficient of friction ($\mu$k) of the resin coating 2 is larger than 0.3, which means that the above-mentioned beneficial effect is not obtained satisfactorily. On the other hand, when the amount of the lubricant contained in the resin coating 2 is more than 20 mass %, the contact electrical resistance (an average of resistances measured at 100 places) is over 100 Ω, which means that the electrical conductivity of the resin coating 2 is worse, so that the shield properties against electromagnetic waves or the earthing properties cannot be obtained satisfactorily. The desirable amount of the lubricant contained in the resin coating 2 is 0.5 to 10 mass %.

As the lubricant, in view of the relation to water thinnable coating materials (described later) used for forming the resin coating 2, for example, a lubricant that dissolves in water, or a lubricant that is dispersed in water by using a suitable emulsifying agent to form an emulsion is desirable. As such lubricants, for example, polyethylene wax, carnaubawax, lanolin, paraffin wax, microcrystalline wax, polytetrafluoroethylene, polyvinyl fluoride, etc. can be mentioned.

The thickness of the resin coating 2 is arranged to be 0.05 to 5 $\mu$m. When the thickness of the resin coating 2 is smaller than 0.05 $\mu$m, the coefficient of friction measured with the device shown in FIG. 3 is larger than 0.5, which means that the sliding properties of the surface of the produced metallic plate material are worse. When the thickness of the resin coating 2 is larger than 5 $\mu$m, the contact electrical resistance of the resin coating 2 (an average of resistances measured at 100 places) is over 100 Ω, which means that the electrical conductivity of the resin coating 2 is worse, so that the shield properties against electromagnetic waves or the earthing properties cannot be obtained satisfactorily. The desirable thickness of the resin coating 2 is 0.1 to 2 μm.

It is desirable that the resin coating 2 further contains one or more substances chosen from acrylamide, polyacrylamide and acrylamide compounds as mentioned below. In that case, the electrical conductivity of the resin coating 2 further improves.

It is desirable that the amount of such substance contained in the resin coating 2 is 5 mass % or more, because when it is less than 5 mass %, the above-mentioned beneficial effect cannot be obtained satisfactorily. The more desirable amount of such substance contained in the resin coating 2 is 30 mass % or more.

As the acrylamide compounds, for example, one or more acrylamide compounds chosen from methylene bisacrylamide, 2-acrylamide-2-methylpropane sulfonate, N-methylolacrylamide, N-methylene sulfonate acrylamide, N-isopropylacrylamide, etc. can be used.

The resin coating 2 may further contain a surface-active agent, because it also can improve the electrical conductivity of the resin coating 2.

It is desirable that the amount of the surface-active agent contained in the resin coating 2 is in the range of 0.5 to 30 mass %. When it is less than 0.5 mass %, the above-mentioned beneficial effect cannot be obtained satisfactorily. When it is more than 30 mass %, the resistance to solvents is worse.

For example, when a resin-coated metallic plate material that contains a surface-active agent in the amount of more than 30 mass % is immerged in boiled trichlene for 5 minutes, the resin coating dissolves in trichlene, so that the resin coating decreases by 10 mass % or more. The more desirable amount of the surface-active agent contained in the resin coating is 3 to 20 mass %.

As the surface-active agent, for example, nonionic surface-active agents such as alkylphenol ethylene adducts and higher alcohol ethylene oxide adducts; anion surface-active agents such as higher alcohol ester sulfate, alkylbenzene sulfonate, and higher alcohol phosphate; and cationic surface-active agents such as higher alkyl amine, alkyltrimethyl ammonium salt and sepamine type quaternary ammonium salt; etc. can be used. It is desirable to use an anion surface-active agent or a cationic surface-active agent, because the anion surface-active agents and the cationic surface-active agents are ionized in water to thereby improve the electrical conductivity.

The metallic plate material according to the present invention is produced by applying a coating material including the components for forming a resin coating as mentioned above, onto the surface of the metallic plate 1, with a thickness of 0.5 to 5 μm.

It is desirable that the coating material is a water thinnable coating material, which means a coating material wherein components such as the above-explained resin, lubricant, and surface-active agent (if needed), and resin-forming components such as a curing agent for curing the resin are dissolved or dispersed in water. What is desirable as the water thinnable coating material is an emulsion coating material wherein each of the above-mentioned components is dispersed as emulsion particles in water as a continuous phase.

Figure 5:
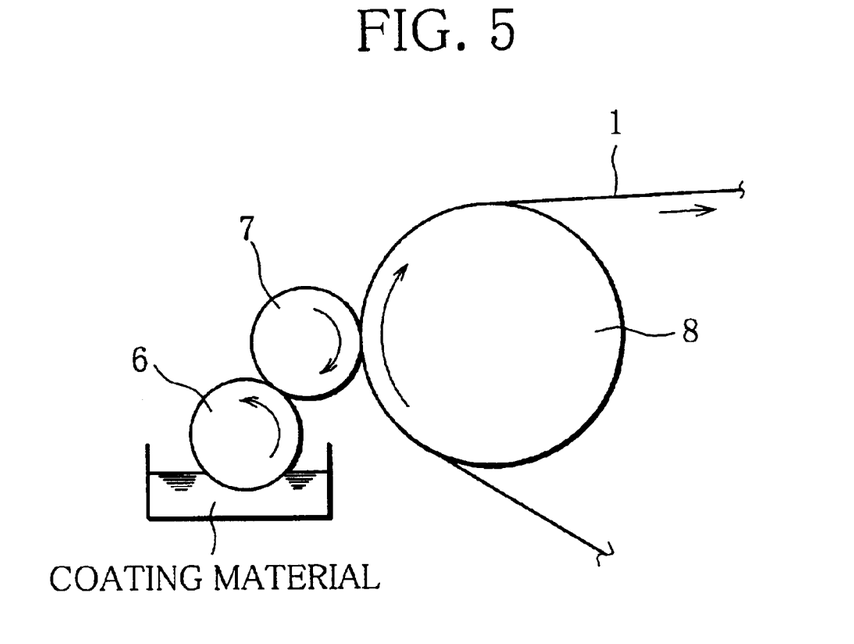
FIG. 5 is a schematic illustration showing an example of a bottom-up application method (reverse rotation)

The water thinnable coating material is applied onto the metallic plate. As an application method, a bottom-up method (reverse rotation) shown in FIG. 5, a top-feed method (natural rotation) shown in FIG. 6, another top-feed method (reverse rotation) shown in FIG. 7, another top-feed method (natural rotation) shown in FIG. 8, etc. can be adopted appropriately. It is desirable to adopt a top-feed method among these application methods.

When the water thinnable coating material is prepared, the amount of each of the components is determined so that the amounts of water, the lubricant and the surface-active agent contained in the resin coating (layer) formed by applying the water thinnable coating material onto the metallic plate may be 1 to 50 mass %, 0.1 to 20 mass %, and 0.5 to 30 mass %, respectively.

Here, the resin, the lubricant, the surface-active agent, etc. form the solid component of the prepared water thinnable coating material. It is desirable that the amount of the solid component of the water thinnable coating material is 3 to 40 mass %.

When the water thinnable coating material wherein the amount of the solid component is less than 3 mass % is used, a gap between an applicator roll and a pickup roll or a gap between an applicator roll and a metering roll in the applying methods shown in FIGS. 5 to 8 needs to be made larger so that such water thinnable coating material may be applied onto the metallic plate. This makes it difficult to form a uniform resin coating and leads to positional variation in electrical conductivity of the resin coating. When the water thinnable coating material wherein the amount of the solid component is more than 40 mass % is used, there is produced a problem that the resin coating is formed with too large a thickness, even if the gap between the rolls is made narrower.

It is more desirable if the amount of the solid component of the water thinnable coating material is fixed in the range of 6 to 27 mass %.

It is desirable that the viscosity of the water thinnable coating material at the temperature of 20° C. is in the range of 5 to 40 seconds in terms of efflux time measured using a No. 4 Ford cup specified in JIS K 5400, i.e., the time required for all the water thinnable coating material to flow out from the No. 4 Ford cup.

Here, how to measure the viscosity will be described.

Figure 9:
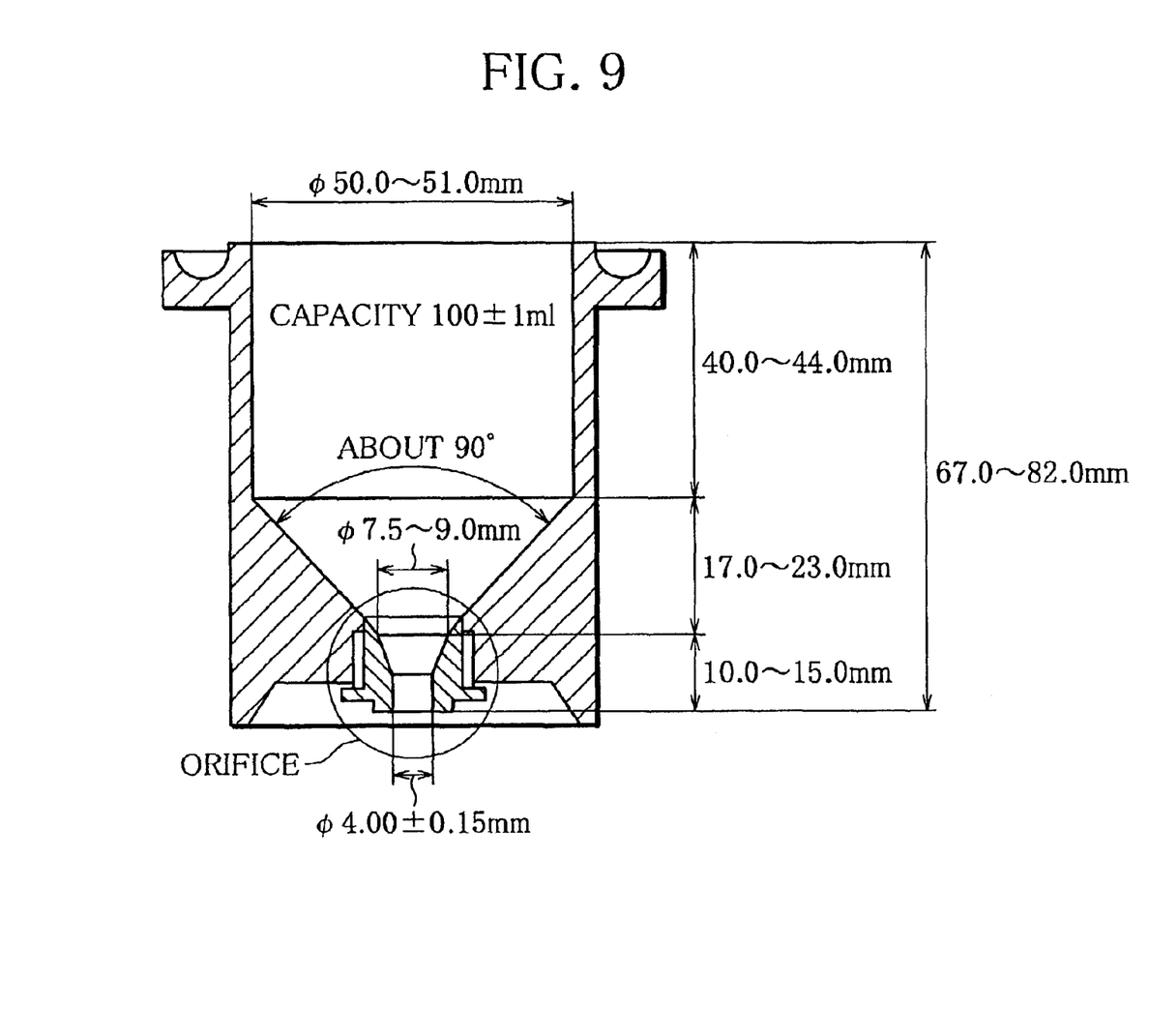
FIG. 9 is a schematic illustration showing the shape of a No. 4 Ford cup specified in JIS K 5400.

FIG. 9 shows the dimensions of the No. 4

Ford cup used for measuring the viscosity. The viscosity is measured as follows:

First, a sample of a to-be-measured water thinnable coating material and the No. 4 Ford cup are kept at 20±1° C. in advance. The measurement is performed also at 20±1° C.

The No. 4 Ford cup is set on a rest, a glass plate is set on the cup, and the cup is kept horizontal. Under the cup is placed a vessel for receiving the water thinnable coating material.

Then, a rubber plate is pressed on an orifice of the cup so that the body temperature may be free to the orifice, and the water thinnable coating material is poured to fill the cup in a manner that bubbles may not be produced in the water thinnable coating material. Then, the glass plate is slid on the upper edge of the cup from the side horizontally, to thereby scrape off excess water thinnable coating material. Then, the rubber plate is taken off.

A stopwatch is started at the same time the glass plate is taken off the upper edge of the cup, and stopped at the time a continuous flow of the water thinnable coating material through the orifice stops.

The time required for the water thinnable coating material to flow out is obtained up to one decimal place and rounded to a whole number in second. The viscosity is expressed in this efflux time.

The water thinnable coating material showing an efflux time shorter than 5 seconds is too low in viscosity. In order to apply it onto the metallic plate, the gap between the rolls as shown in FIGS. 5 to 8 needs to be made larger. This makes it difficult to form a uniform resin coating and leads to positional variation in electrical conductivity of the resin coating. The water thinnable coating material showing an efflux time longer than 40 seconds is too high in viscosity, and causes a problem that the resin coating is formed with too large a thickness, even if the gap between the rolls is made narrower.

The more desirable viscosity of the water thinnable coating material is 6 to 30 seconds in terms of efflux time.

It is desirable that prior to forming a resin coating on the metallic plate, the metallic plate undergoes pre-treatment such as rinse chromate treatment such as phosphate chromate or chromic chromate, non-rinse chromate treatment wherein resin containing chromium is applied, or non-chromium treatment wherein zirconium or titanium is used in place of chrome. This is because the pre-treatment as above allows the resin coating to adhere to the metallic plate better, and also improves the resistance to corrosion of the produced metallic plate material.

[Embodiment]

Embodiments 1 to 23, Comparison Examples 1 to 9

(1) Preparation of Coating Materials

Each of the different coating materials shown in tables 1 and 2 was prepared using the components specified in tables 1 and 2, where water or a solvent was used so that the amount of the solid component might be that specified in tables 1 and 2 (mass %).

It is to be noted that the resin in each coating material shown in tables 1 and 2 consists of a base resin and an acrylamide substance. The amount of a base resin and the amount of an acrylamide substance are shown by mass % where the amount of the whole resin, which are part of the solid component of each coating material, is considered 100. On the other hand, the amount of a lubricant as well as the amount of a surface-active agent in tables 1 and 2 is shown by mass % where the amount of the solid component in each coating material is considered 100.

Also the viscosity of each coating material is shown in tables 1 and 2 in terms of efflux time (second).

TABLE 1

| | Resin | | | | | | | | Amount of solid compo- | |
|---|---|---|---|---|---|---|---|---|---|---|
| | Base resin | | Acrylamide substance | | Lubricant | | Surface-active agent | | | |
| | Kind | Amount (mass %) | Kind | Amount (mass %) | Kind | Amount (mass %) | Kind | Amount (mass %) | Base of coating material | nent (mass %) | Viscosity (sec) |
| Coating material 1 | Bisphenol A epoxy resin | 90 | Acrylamide | 10 | Polyethylene wax | 0.2 | Nonionic *1 | 3.5 | Water | 7 | 8 |
| Coating material 2 | Acrylate resin Ethyl acrylate resin | 30 40 | N-methyrol-acrylamide | 30 | Lanolin | 19 | Anionic *2 | 17 | Water | 29 | 25 |
| Coating material 3 | Acrylate resin | 90 | Methylene-bis-acrylamide | 10 | Carnauba wax | 5 | Nonionic | 10 | Water | 10 | 12 |
| Coating material 4 | — | — | Polyacrylamide | 100 | Polyethylene wax | 10 | Anionic | 7.0 | Water | 8 | 10 |
| Coating material 5 | Methacrylate resin | 50 | Acrylamide-N-methylene sulfonate | 50 | Polyethylene wax | 0.8 | Anionic | 0.6 | Water | 13 | 15 |
| Coating material 6 | Bisphenol A epoxy resin n-propyl metacrylate resin | 32 68 | — | — | Polytetra-fluoroethylene | 9 | Anionic | 29 | Water | 18 | 21 |
| Coating material 7 | Acrylate resin Methyl metacrylate resin Bisphenol A epoxy resin | 10 40 50 | — | — | Lanolin | 3.8 | Cationic *3 | 4.5 | Water | 4 | 7 |
| Coating material 8 | Acryl denatured epoxy resin Isopropyl metacrylate resin | 80 20 | — | — | Lanolin | 6.9 | Anionic | 8.9 | Water | 39 | 40 |
| Coating material 9 | Acrylate resin Bisphenol A epoxy resin Phenol resin | 20 70 10 | — | — | Polyethylene wax | 3 | Anionic | 5 | Water | 24 | 28 |
| Coating material 10 | Methacrylate rein Bisphenol A epoxy resin | 28 72 | — | — | Polyethylene wax | 3.2 | — | — | Water | 15 | 15 |

TABLE 2

| | Resin | | | | Lubricant | | Surface-active agent | | Base of coating material | Amount of solid component (mass %) | Viscosity (sec) |
|---|---|---|---|---|---|---|---|---|---|---|---|
| | Base resin | | Acrylamide substance | | | | | | | | |
| | Kind | Amount (mass %) | Kind | Amount (mass %) | Kind | Amount (mass %) | Kind | Amount (mass %) | | | |
| Coating material 11 | Bisphenol A epoxy resin | 68 | Polyacrylamide | 32 | Paraffin wax | 14 | Cationic | 0.4 | Water | 2 | 7 |
| Coating material 12 | Methacrylate resin | 75 | — | — | Polyethylene wax | 6.0 | Anionic | 33 | Water | 15 | 20 |
| | Bisphenol A epoxy resin | 25 | | | | | | | | | |
| Coating material 13 | Polyether urethane resin | 100 | — | — | Paraffin wax | 2 | Anionic | 0.4 | Water | 42 | 45 |
| Coating material 14 | Polyester resin | 100 | — | — | Polytetrafluoroethylene | 9 | — | — | Water | 21 | 24 |
| Coating material 15 | Bisphenol A epoxy resin | 100 | — | — | Polyethylene wax | 5.9 | — | — | Solvent | 10 | 15 |
| Coating material 16 | Methacrylate resin | 100 | — | — | Lanolin | 10 | — | — | Solvent | 20 | 20 |
| Coating material 17 | Fluororesin | 100 | — | — | Polyethylene wax | 1.2 | — | — | Solvent | 18 | 23 |
| Coating material 18 | Polyester resin | 80 | — | — | Paraffin wax | 13 | — | — | Solvent | 24 | 26 |
| | Silver particles (average particle size: 5 μm) | 20 | | | | | | | | | |
| Coating material 19 | Bisphenol F epoxy resin | 100 | — | — | Lanolin | 0.07 | — | — | Water | 20 | 24 |
| Coating material 20 | Methyl methacrylate resin | 35 | Methylene-bis-acrylamide | 65 | Polyethylene wax | 22 | — | — | Water | 14 | 20 |

*1: Nonylphenolethyleneoxide adduct
*2: Higher alcohol sulfate
*3: Alkyltrimethyl ammonium salt (2) Production and Evaluation of Metallic Plate Materials The metallic plates of various kinds shown in tables 3 and 4 were first degreased using a degreasing agent that was on the market. Then, the coating materials shown in tables 1 and 2 were applied onto the metallic plates with various thicknesses by the application methods of various kinds shown in tables 3 and 4. Then, the metallic plates were baked and thereby dried. Thus, the metallic plate materials each coated with a dried resin coating were obtained. In each dried resin coating, the solid component (containing resin, a lubricant, and a surface-active agent) of each coating material had been cured.

Then, the amount of water contained in the resin coating of each of the obtained metallic plate materials was measured in the following way.

First, the mass (M) of a resin coating of a sample piece was measured. Then, the sample piece was heated in an oven at the temperature of 105° C. for 1 hour, and then the mass (M') of the resin coating of the sample piece was measured and the value of an expression $(M-M') \times 100/M$ was calculated. Since it can be considered that all the water contained in the resin coating had flown away during heating, the value of the expression can be considered as the amount of water that had been contained in the resin coating (expressed in mass %).

It may be considered that the amount of a lubricant contained in each resin coating corresponds to the amount of the lubricant contained in the solid component of a used coating material (shown in tables 1 and 2).

The obtained metallic plate materials were measured and evaluated in electrical conductivity, formabilities, lubricity, sliding properties, and resistance to solvents, in the following ways.

1. Electrical Conductivity

As an index of earthing properties and shield properties against electromagnetic waves, contact resistance was measured at 100 places of each resin coating 2, using the device shown in FIG. 2, and an average of those measured values was obtained. As the tester 5, 3030-10 HiTESTER (produced by Hioki E.E. Corporation) was used.

Further, when the contact resistance was measured at 100 places of each resin coating, the number of places which showed an overrange (the number of not electrically-conductive places) in contact resistance was counted to thereby examine positional variation in electrical conductivity.

2. Formabilities

Cylindrical drawing was performed with each metallic plate material with the conditions below, to find a forming height. Further, a resin coating on a sidewall of each molded metallic plate material was observed with an SEM. Thus, the appearance of the resin coating was examined.

The conditions for the cylindrical drawing: Molding speed: 20 mm/sec, Punch diameter: 40 mm, Die diameter: 42.4 mm, Blank diameter: 84 mm.

The forming height of 6 mm or higher was considered very good (◎), that of 5.5 mm or higher and lower than 6 mm was considered good (○), and that lower than 5 mm was considered bad (x).

3. Lubricity and Sliding Properties

The coefficients of friction of each metallic plate material were measured, using the device shown in FIG. 1 and the device shown in FIG. 3, respectively.

4. Resistance to Solvents

A sample piece of 100 mm square was cut from each metallic plate material and soaked in boiled trichlene for 5 minutes. Then, the decrease in mass, which was caused by the resin coating dissolving in trichlene, was measured, and the dissolving rate (%) was calculated. The dissolving rate of 5% or lower was considered very good (◎), that of 10% or lower and higher than 5% was considered good (○), and that of 10% or higher was considered bad (x), The results are shown in a lump in tables 3 and 4.

TABLE 3

Figure 6:
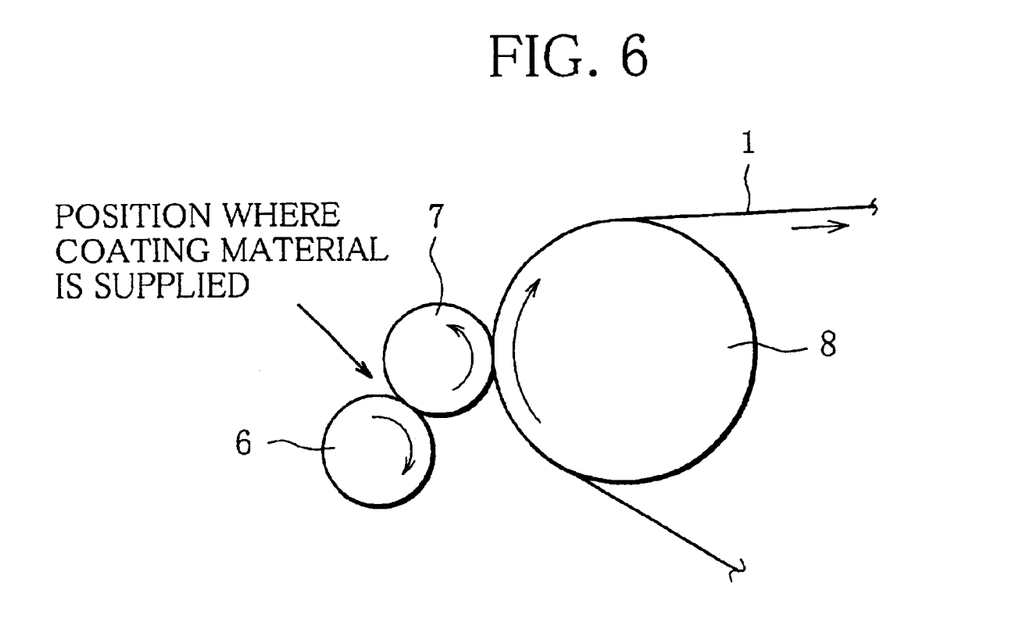
FIG. 6 is a schematic illustration showing an example of a top-feed application method (natural rotation)
Figure 7:
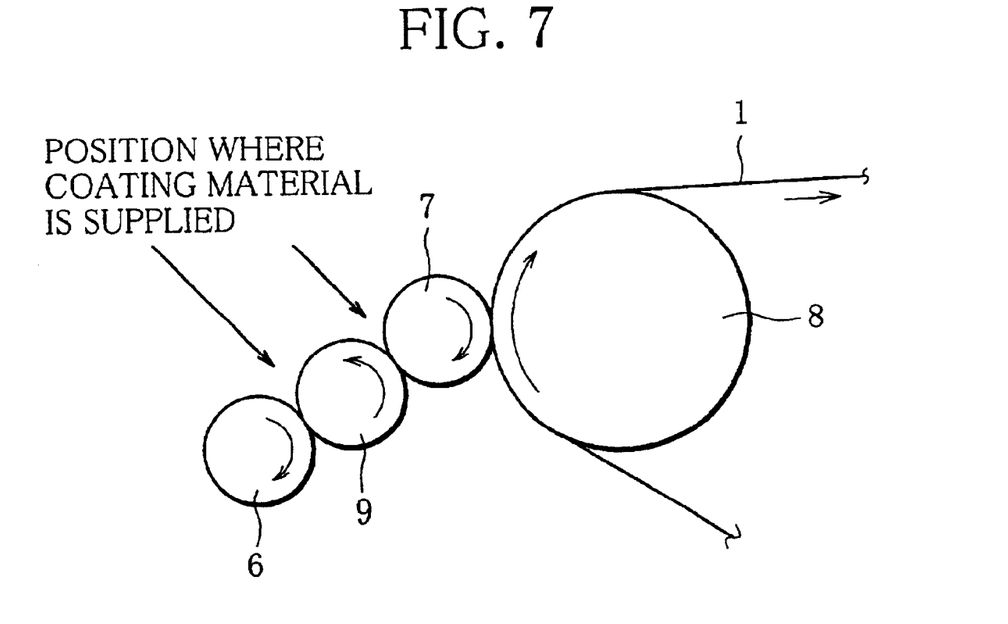
FIG. 7 is a schematic illustration showing an example of another top-feed application method (reverse rotation)
Figure 8:
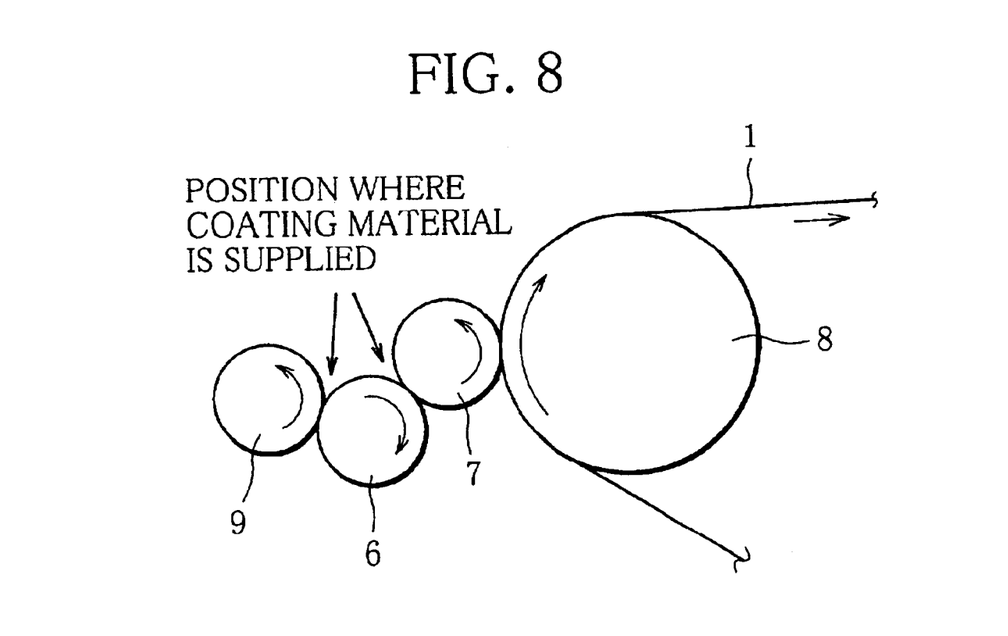
FIG. 8 is a schematic illustration showing an example of another top-feed application method (natural rotation)

| | Conditions for producing metallic plate material | | | Resin coating | | | Properties | | | | | |
|---|---|---|---|---|---|---|---|---|---|---|---|---|
| | | | | | | | Electrical conductivity | | | Sliding properties | | |
| | Kind of metallic plate | Coating method | Used coating material | Thickness (μm) | Amount of water (mass %) | Amount of lubricant (mass %) | Contact resistance (Ω) | Number of non-conductive places | Formabilities | Lubricity Co-efficient of friction | Co-efficient of friction | Resistance to solvents |
| Embodiments | | | | | | | | | | | | |
| 1 | Aluminum alloy plate | Top-feed method in FIG. 6 (natural rotation) | Coating material 9 | 0.5 | 1.2 | 3 | 7.0 | 0 | ◉ | 0.08 | 0.14 | ◉ |
| 2 | Aluminum alloy plate | Top-feed method in FIG. 6 (natural rotation) | Coating material 9 | 0.6 | 5.9 | 3 | 4.2 | 0 | ◉ | 0.09 | 0.15 | ◉ |
| 3 | Aluminum alloy plate | Top-feed method in FIG. 6 (natural rotation) | Coating material 9 | 0.5 | 30 | 3 | 2.8 | 0 | ◉ | 0.09 | 0.17 | ◉ |
| 4 | Aluminum alloy plate | Top-feed method in FIG. 6 (natural rotation) | Coating material 9 | 0.5 | 48 | 3 | 2.0 | 0 | ◉ | 0.10 | 0.19 | ○ |
| 5 | Aluminum alloy plate | Top-feed method in FIG. 6 (natural rotation) | Coating material 1 | 0.5 | 4.4 | 0.2 | 5 | 0 | ○ | 0.18 | 0.28 | ◉ |
| 6 | Aluminum alloy plate | Top-feed method in FIG. 6 (natural rotation) | Coating material 2 | 0.7 | 10 | 19 | 12 | 0 | ◉ | 0.05 | 0.20 | ◉ |
| 7 | Aluminum alloy plate | Top-feed method in FIG. 7 (reverse rotation) | Coating material 3 | 0.6 | 11 | 5 | 7 | 0 | ◉ | 0.07 | 0.21 | ◉ |
| 8 | Aluminum alloy plate | Top-feed method in FIG. 7 (reverse rotation) | Coating material 4 | 0.5 | 22 | 10 | 6 | 0 | ◉ | 0.07 | 0.14 | ◉ |
| 9 | Aluminum alloy plate | Top-feed method in FIG. 8 (natural rotation) | Coating material 5 | 0.6 | 10 | 0.8 | 14 | 0 | ◉ | 0.17 | 0.27 | ◉ |
| 10 | Stainless steel plate | Top-feed method in FIG. 8 (natural rotation) | Coating material 6 | 0.6 | 33 | 9 | 13 | 0 | ◉ | 0.04 | 0.16 | ◉ |
| 11 | Stainless steel plate | Top-feed method in FIG. 6 (natural rotation) | Coating material 7 | 0.3 | 11 | 3.8 | 4 | 0 | ◉ | 0.06 | 0.14 | ◉ |
| 12 | Stainless steel plate | Top-feed method in FIG. 6 (natural rotation) | Coating material 8 | 3 | 37 | 6.9 | 48 | 0 | ◉ | 0.05 | 0.12 | ◉ |
| 13 | Stainless steel plate | Top-feed method in FIG. 7 (reverse rotation) | Coating material 9 | 0.06 | 4.9 | 3 | 3.1 | 0 | ◉ | 0.17 | 0.27 | ◉ |
| 14 | Stainless steel plate | Top-feed method in FIG. 7 (reverse rotation) | Coating material 9 | 4.8 | 14 | 3 | 76 | 0 | ◉ | 0.09 | 0.08 | ◉ |
| 15 | Galvanized steel plate | Top-feed method in FIG. 8 (natural rotation) | Coating material 11 | 0.7 | 0.7 | 14 | 49 | 0 | ◉ | 0.06 | 0.18 | ◉ |
| 16 | Copper plate | Top-feed method in FIG. 8 (natural rotation) | Coating material 9 | 0.8 | 20 | 3 | 4.8 | 0 | ◉ | 0.16 | 0.14 | ◉ |
| 17 | Aluminum alloy plate | Top-feed method in FIG. 6 (natural rotation) | Coating material 10 | 0.5 | 10 | 3.2 | 41 | 0 | ◉ | 0.09 | 0.24 | ◉ |

TABLE 4

| | Conditions for producing metallic plate material | | | Resin coating | | | Properties | | | | | |
|---|---|---|---|---|---|---|---|---|---|---|---|---|
| | | | | | | | Electrical conductivity | | | Sliding properties | | |
| | Kind of metallic plate | Coating method | Used coating material | Thickness (μm) | Amount of water (mass %) | Amount of lubricant (mass %) | Contact resistance (Ω) | Number of non-conductive places | Formabilities | Lubricity Co-efficient of friction | Co-efficient of friction | Resistance to solvents |
| Embodiments | | | | | | | | | | | | |
| 18 | Aluminum alloy plate | Top-feed method in FIG. 6 (natural rotation) | Coating material 13 | 4.5 | 2.1 | 2 | 78 | 0 | ◉ | 0.07 | 0.22 | ◉ |
| 19 | Aluminum alloy plate | Top-feed method in FIG. 6 (natural rotation) | Coating material 11 | 0.06 | 5.5 | 14 | 3 | 0 | ◉ | 0.14 | 0.26 | ◉ |
| 20 | Aluminum alloy plate | Top-feed method in FIG. 6 (natural rotation) | Coating material 12 | 0.7 | 8.7 | 6 | 6 | 0 | ◉ | 0.06 | 0.13 | ○ |

TABLE 4-continued

| | Conditions for producing metallic plate material | | Resin coating | | | Properties | | | | | |
|---|---|---|---|---|---|---|---|---|---|---|---|
| | | | | | Amount | Electrical conductivity | | | Sliding properties | | |
| | Kind of metallic plate | Coating method | Used coating material | Thickness (μm) | Amount of water (mass %) | of lubricant (mass %) | Contact resistance (Ω) | Number of non-conductive places | Formabilities | Lubricity Coefficient of friction | ties Coefficient of friction | Resistance to solvents |
| 21 | Aluminum alloy plate | Top-feed method in FIG. 6 (natural rotation) | Coating material 15 | 0.08 | 2 | 5.9 | 88 | 0 | ⊚ | 0.10 | 0.16 | ⊚ |
| 22 | Aluminum alloy plate | Top-feed method in FIG. 6 (natural rotation) | Coating material 16 | 0.07 | 5 | 10 | 79 | 0 | ⊚ | 0.06 | 0.19 | ⊚ |
| 23 | Aluminum alloy plate | Bottom-up Method | Coating material 9 | 0.5 | 28 | 3 | 21 | 0 | ⊚ | 0.07 | 0.15 | ⊚ |
| Comparison Examples | | | | | | | | | | | | |
| 1 | Aluminum alloy plate | Top-feed method in FIG. 6 (natural rotation) | Coating material 14 | 1.0 | 12 | 9 | Over-range | 100 | ⊚ | 0.07 | 0.12 | ⊚ |
| 2 | Aluminum alloy plate | Top-feed method in FIG. 6 (natural rotation) | Coating material 17 | 0.2 | 45 | 1.2 | Over-range | 100 | ⊚ | 0.05 | 0.10 | ⊚ |
| 3 | Aluminum alloy plate | Top-feed method in FIG. 6 (natural rotation) | Coating material 2 | 0.3 | 0.5 | 19 | 110 | 5 | ⊚ | 0.06 | 0.21 | ⊚ |
| 4 | Aluminum alloy plate | Top-feed method in FIG. 6 (natural rotation) | Coating material 2 | 0.3 | 56 | 19 | 5 | 0 | ⊚ | 0.07 | 0.26 | x |
| 5 | Aluminum alloy plate | Top-feed method in FIG. 6 (natural rotation) | Coating material 18 | 1.8 | 10 | 13 | 4 | 6 | ⊚ | 0.12 | 0.13 | ⊚ |
| 6 | Aluminum alloy plate | Top-feed method in FIG. 6 (natural rotation) | Coating material 19 | 0.6 | 14 | 0.07 | 7 | 0 | x | 0.32 | 0.53 | ⊚ |
| 7 | Aluminum alloy plate | Top-feed method in FIG. 6 (natural rotation) | Coating material 20 | 0.7 | 9.5 | 22 | 120 | 3 | ⊚ | 0.04 | 0.08 | ⊚ |
| 8 | Aluminum alloy plate | Top-feed method in FIG. 6 (natural rotation) | Coating material 9 | 0.03 | 12 | 3 | 2 | 0 | ○ | 0.23 | 0.56 | ⊚ |
| 9 | Aluminized alloy plate | Top-feed method in FIG. 6 (natural rotation) | Coating material 9 | 6 | 12 | 3 | 200 | 4 | ⊚ | 0.08 | 0.14 | ⊚ |

As is clear from tables 3 and 4, in all the embodiments 1 to 23 of the present invention, the metallic plate materials are good in electrical conductivity, formabilities, lubricity, sliding properties, etc. Thus, they have enough properties to be plate materials for an electric/electronic instrument.

Embodiment 4 was a little worse in resistance to solvents because the amount of water contained in the resin coating was a little larger. Embodiment 5 was a little worse in formabilities because the amount of the lubricant contained in the coating material 1 was small. Embodiment 18 was a little worse in contact resistance, because the amount of the solid component and the viscosity of the coating material 13 were a little larger and the thickness of coating became a little thicker. Embodiment 20 was a little worse in resistance to solvents, because the amount of the surface-active agent contained in the coating material 12 was a little larger. Embodiments 21 and 22 were a little worse in contact resistance, because not water thinnable coating materials were used.

These embodiments can however be used practically, without any problem.

As is clear from the description above, in the metallic plate material according to the present invention, the resin coating that forms a surface of the metallic plate material does not contain an electrically-conductive agent such as metallic powder, unlike the resin coating of the conventional metallic plate material. In addition, the metallic plate material according to the present invention is good in earthing properties, shield properties against electromagnetic waves, formabilities, lubricity, sliding properties, resistance to solvents etc. Therefore, as a material for a casing for containing parts of various electric/electronic instruments, the metallic plate material according to the present invention has a very high industrial value.

What is claimed is:

1. A metallic plate material for an electric/electronic instrument, comprising:
   a resin-coated metallic plate material, wherein said resin coating comprises at least one substance chosen from a group consisting of acryl-based resin, epoxy-based resin, and urethane-based resin, said resin coating contains at least one acrylamide substance chosen from a group of acrylamide, polyacrylamide and acrylamide compounds in the amount of 5 mass % or more,
   contains water in the amount of 1 to 50 mass % and a lubricant in the amount of 0.1 to 20 mass %, and
   has a thickness of 0.05 to 5 μm.

2. The metallic plate material for an electric/electronic instrument according to claim 1, wherein said resin coating further comprises a surface-active agent in the amount of 0.5 to 30 mass %.

3. The metallic plate material for an electric/electronic instrument according to claim 1, wherein
   said resin coating is a layer formed by applying a water thinnable coating material, wherein said water thinnable coating material comprises at least one substance chosen from a group consisting of acryl-based resin, epoxy-based resin and urethane-based resin, and a lubricant in the amount of 0.1 to 20 mass %, wherein a solid component of said water thinnable coating material includes at least one acrylamide substance chosen from a group of acrylamide, polyacrylamide and acrylamide compounds in the amount of 5 mass % or more, and said layer comprises water in the amount of 1 to 50 mass %.

4. The metallic plate material for an electric/electronic instrument according to claim 3, wherein a solid component of said water thinnable coating material includes a surface-active agent in the amount of 0.5 to 30 mass %.

5. The metallic plate material for an electric/electronic instrument according to either one of claim 3 or 4, wherein the amount of the solid component of said water thinnable coating material is 3 to 40 mass %, and said water thinnable coating material has a viscosity of 5 to 50 seconds in efflux time measured using a No. 4 Ford cup specified in JIS K5400, at a temperature of 20° C.

6. The metallic plate material for an electric/electronic instrument according to either one of claim 3 or 4, wherein said layer is formed by applying said water thinnable coating material in a top-feed method.

7. The metallic plate material for an electric/electronic instrument according to claim 5, wherein said layer is formed by applying said water thinnable coating material in a top-feed method.

8. An electric/electronic instrument comprising the metallic plate material according to any of claims 2, 3 or 4.

9. An electric/electronic instrument comprising the metallic plate material according to claim 5.

10. An electric/electronic instrument comprising the metallic plate material according to claim 6.

11. An electric/electronic instrument comprising the metallic plate material according to claim 7.

* * * * *